US008674859B2

(12) United States Patent
Bordes et al.

(10) Patent No.: US 8,674,859 B2
(45) Date of Patent: Mar. 18, 2014

(54) METHODS FOR ARITHMETIC CODING AND DECODING AND CORRESPONDING DEVICES

(75) Inventors: Philippe Bordes, Cesson Sevigne Cedex (FR); Dominique Thoreau, Cesson Sevigne Cedex (FR); Jerome Vieron, Paris (FR); Edouard Francois, Bourg des Comptes (FR)

(73) Assignee: Thomson Licensing, Issy les Moulineaux (FR)

( * ) Notice: Subject to any disclaimer, the term of this patent is extended or adjusted under 35 U.S.C. 154(b) by 0 days.

(21) Appl. No.: 13/381,911

(22) PCT Filed: Jun. 22, 2010

(86) PCT No.: PCT/EP2010/058770
§ 371 (c)(1),
(2), (4) Date: May 21, 2012

(87) PCT Pub. No.: WO2011/000734
PCT Pub. Date: Jan. 6, 2011

(65) Prior Publication Data
US 2012/0218131 A1 Aug. 30, 2012

(30) Foreign Application Priority Data

Jul. 1, 2009 (FR) ...................................... 09 54483

(51) Int. Cl.
*H03M 7/00* (2006.01)
(52) U.S. Cl.
USPC ................ 341/107; 341/65; 341/67; 341/106
(58) Field of Classification Search
USPC ...................... 341/65, 67, 106, 107
See application file for complete search history.

(56) References Cited

U.S. PATENT DOCUMENTS

| 6,265,997 | B1 * | 7/2001 | Nomizu | 341/107 |
|---|---|---|---|---|
| 7,058,231 | B2 * | 6/2006 | Peters | 382/247 |
| 7,281,771 | B1 * | 10/2007 | Wen et al. | 341/107 |
| 7,292,165 | B2 * | 11/2007 | Cha et al. | 341/107 |
| 7,460,721 | B2 * | 12/2008 | Peters | 382/238 |
| 7,864,086 | B2 * | 1/2011 | Monro | 341/107 |
| 7,957,600 | B2 * | 6/2011 | Yang | 382/232 |
| 2004/0223654 | A1 * | 11/2004 | Peters | 382/239 |
| 2005/0088324 | A1 * | 4/2005 | Fuchigami et al. | 341/107 |
| 2006/0158355 | A1 * | 7/2006 | Jeon et al. | 341/50 |
| 2006/0210179 | A1 * | 9/2006 | Peters | 382/232 |
| 2008/0218390 | A1 * | 9/2008 | Kim et al. | 341/107 |

FOREIGN PATENT DOCUMENTS

EP 0448802 10/1991

OTHER PUBLICATIONS

D. Salomon: "Data Compression", 2007, pp. 89-91.
D. Salomon: "Data Compression", 2007, pp. 125-127.
Search Report Dated Aug. 10, 2010.

* cited by examiner

*Primary Examiner* — Linh Nguyen
(74) *Attorney, Agent, or Firm* — Tutunjian & Bitetto, P.C.

(57) ABSTRACT

A method for arithmetic coding of symbols in a stream is described. The method comprises the following steps:
coding a current symbol with a current probability model, and
updating the current probability model according to the coding of the current symbol.
selecting the current probability model in a set of at least two probability models according to a coding cost criterion, and
coding an identifier of the selected probability model.

15 Claims, 9 Drawing Sheets

METHODS FOR ARITHMETIC CODING AND DECODING AND CORRESPONDING DEVICES

This application claims the benefit, under 35 U.S.C. §365 of International Application PCT/EP2010/058770, filed Jun. 22, 2010, which was published in accordance with PCT Article 21 on Jan. 6, 2011 in English and which claims the benefit of French patent application No. 0954483, filed Jul. 1, 2009.

1. SCOPE OF THE INVENTION

The invention relates to the domain of coding of symbols, for example of symbols representative of an image signal. More specifically, the invention relates to a method for arithmetic coding of symbols in a stream. The invention also relates to a method for arithmetic decoding of symbols coded in the form of a stream.

2. PRIOR ART

To transform symbols representative of a signal, for example a video or audio signal, into binary codes, it is known in the art to use a method of entropy coding. Such an entropy coding method associates a shorter binary word with the most frequent symbol values, i.e. those for which the appearance probability is highest, in order to reduce the coding cost. As an example a symbol S taking the values {a, b, c} with the probabilities ¼, ½ et ¼, can be considered, then an entropy coding method would associate for example a binary code of length 1 if the symbol S takes the value 'b', i.e. that for which the appearance probability is highest.

The VLC (Variable Length Coding) coding is a known example of an entropy coding method. According to this method, a VLC table is defined for each symbol. A table associates with each possible value of the symbol with which it is associated a binary code for which the length depends on the probability that the symbol in question takes said value, i.e. of the probability of the appearance of said value. These tables are defined by analysing a very large number of signals representative of signal that must be coded subsequently. This analysis step is carried out off-line and the tables are transmitted once to the decoder or are defined in a coding standard in which case they are known to the decoder without needing to be transmitted.

Arithmetic Coding is another example of an entropy coding method. According to this method, the probabilities that a symbol takes a value are initialised for example at the image start or image slice in the case of symbols representative of an image. These probabilities are then respectively updated regularly during the image coding of the image slice in order to take into account the characteristics of the source signal that is being coded.

One of the disadvantages of the aforementioned coding methods is that the probability that a symbol takes a given value is intrinsically linked to the characteristics of the source signal which is not known a priori.

Figure 1:
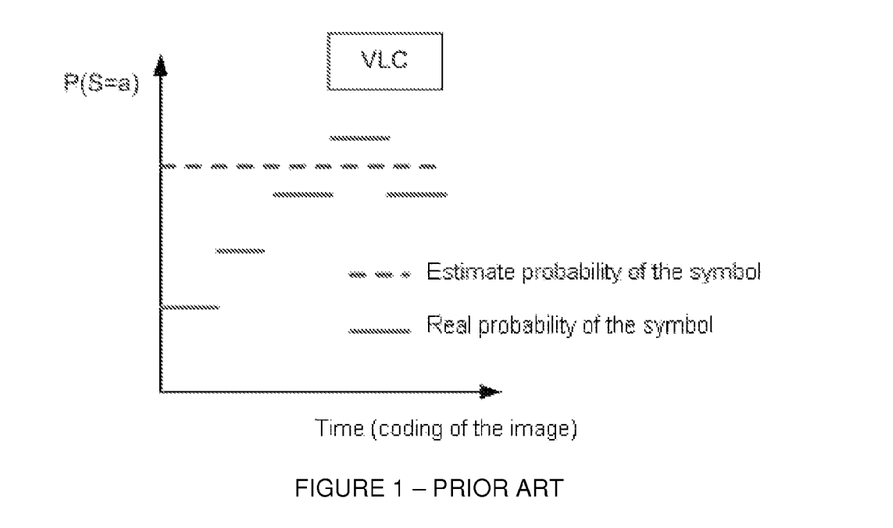
FIG. 1 represents the change, during the coding of a source signal, in the real probability and in the estimated probability according to the VLC method that a symbol S takes a value 'a'.
Figure 2:
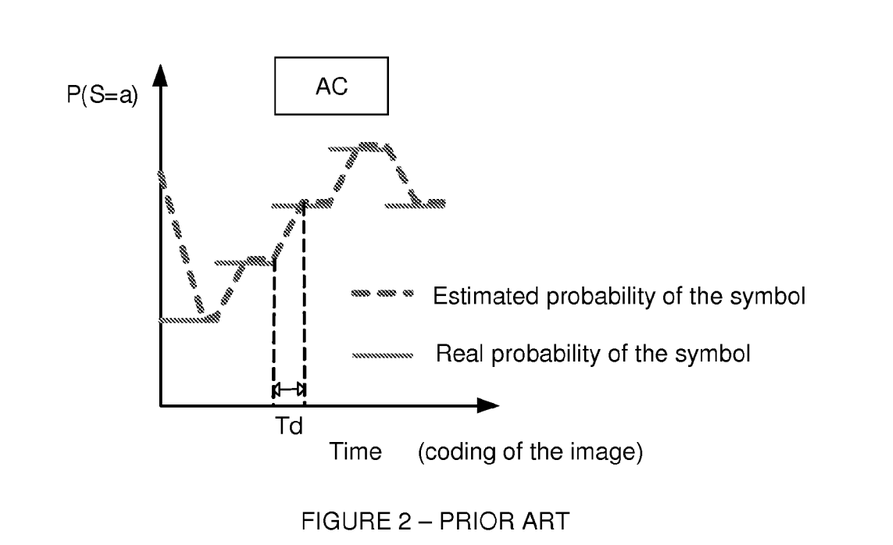
FIG. 2 represents the change, during the coding of a source signal, in the real probability and in the estimated probability according to the AC method that a symbol S takes a value 'a'.

This disadvantage is illustrated by FIGS. 1 and 2. In each of these figures is shown on the x-axis the progression of the coding process of an image and on the y-axis the probability that the symbol S takes the value 'a'. The solid lines represent the progression of the real probability P(S=a) during the coding of the image. The dotted lines represent the corresponding estimated probability. In the VLC case (FIG. 1), the estimated probability is considered as constant throughout the image. In the AC case (FIG. 2), the estimated probability is updated according to the coding of the image. However, this update presumes a convergence time (Td) before attaining the real probability.

In the two aforementioned examples, the estimated probability is either set a priori according to the analysis carried out previous to the coding of the current source signal and can thus be distanced from the real probability (VLC case), or it is regularly updated during the coding of the current signal in order to get closer to the real probability but with a delay time (AC case) all the greater as the real probability fluctuates during the coding process.

3. SUMMARY OF THE INVENTION

The purpose of the invention is to overcome at least one of the disadvantages of the prior art.

The invention relates to an arithmetic method for coding symbols in a stream, comprising the following steps:
coding a current symbol according to a current probability model, and
updating the current probability model according to the coding of the current symbol.

The method also comprises, in the switching points distributed in the stream, the following steps:
selecting the current probability model in a set of at least two probability models according to a coding cost criterion, and
coding an identifier of a selected probability model.

Advantageously the arithmetic coding method according to the invention enables the real probability to be approached more rapidly than with a standard VLC or AC type method and thus enables the symbol or symbols to be coded more efficiently, i.e. at a lower coding cost.

According to a second embodiment of the invention, the steps of the arithmetic coding method are reiterated to code a succession of symbols and the set of at least two probability models comprises a first probability model defined from symbols coded previous to the current symbol and a subset of probability models comprising at least a second probability model defined by default.

According to a third embodiment, the arithmetic coding method comprises a step of addition of a first probability model in the subset of probability models.

According to a particular aspect of the invention, when the number of probability models in the subset of probability models is equal to a threshold value, the first probability model is added as a replacement for the probability model of the subset of probability models least often selected with the exception of the second probability model defined by default.

According to a variant of the invention, when the number of probability models in the subset of probability models is equal to a threshold value, the first probability model is added as a replacement for the oldest probability model of the subset of probability models with the exception of the second probability model defined by default.

According to another variant of the invention, when the number of probability models in the subset of probability models is equal to a threshold value, the first probability model is added as a replacement, among the P probability models of the subset of probability models least often selected, of the probability model for which the average of coding costs calculated when the probability model is selected is highest, where P in an integer.

According to another particular aspect of the invention, the selection step comprises the following steps:
calculating a coding cost for each of the probability models of the set of at least two probability models, and selecting the probability model from the set of at least two probability models for which the coding cost is less than each of the coding costs of the other probability models of the set of at least two probability models.

According to another particular aspect of the invention, the calculation step, for each of the probability models of the set of at least two probability models, of the coding cost comprises the following steps:

coding an integer number N of blocks of image data with each of the probability models of the set of at least two probability models, determining, for each of the probability models of the set of at least two probability models, the coding cost of N blocks of image data and the distortion associated with the coding of N blocks of image data, and calculating, for each of the probability models of the set, the weighted sum of the coding cost and the distortion.

According to a particular characteristic of the invention, the switching points are distributed uniformly in the stream.

According to another particular characteristic, the distribution of switching points in the stream is a function of the number of blocks coded according to a given coding mode.

According to another particular characteristic, the positions in the stream of switching points are transmitted in the stream.

According to another particular characteristic, the positions in the stream of switching points are signalled by a particular sequence of bits.

According to a particular aspect of the embodiment, the arithmetic coding method according to the invention, also comprises a step of initialization of the set of probability models by the probability model defined by default at the start of each image or each slice of images.

According to a particular characteristic of the invention, the initialization step is only applied in reference images.

The invention also relates to a method for arithmetic decoding of symbols coded in the form of a stream, comprising the following steps:

decoding a current symbol according to a current probability model, and updating the current probability model according to the decoding of the current symbol.

The method also comprises, in the switching points distributed in the stream, the following steps:

decoding an identifier of a probability model, selecting the current probability model in a set of at least two probability models according to the decoded identifier.

According to another embodiment of the invention, the steps of the arithmetic coding method are reiterated to decode a succession of symbols and in which the set of at least to probability models comprises a first probability model defined from symbols decoded previous to the current symbol and a subset of probability models comprising at least a second probability model defined by default.

4. LIST OF FIGURES

The invention will be better understood and illustrated by means of embodiments and advantageous implementations, by no means limiting, with reference to the figures in the appendix, wherein.

5. DETAILED DESCRIPTION OF THE INVENTION

AC entropy coding comprises principally the following steps to code a current symbol Sc:

coding of the current symbol Sc according to a current probability model Pc, and updating the current probability model Pc according to the coding of the current symbol Sc.

A probability model associates with each possible value of a symbol a probability. For example, if the symbol Sc takes the values in the set {a, b, c, d} then a probability is associated with each value 'a', 'b', 'c' and 'd'. If the symbol Sc takes the value 'b' then in the step of updating of the current probability model Pc, the associated probability is increased, i.e. the occurrence number F(Sc=b) is increased by 1. The current probability model Pc used to code the current symbol Sc is defined from symbols coded previous to the current symbol Sc. If the current symbol Sc is the first coded then the current probability model Pc is defined by default, for example as a uniform probability model. If the current symbol Sc is the $N^{th}$ symbol coded then the current probability model Pc depends on the coding of $(N-1)^{th}$ symbols coded previous to the current symbol Sc. In fact, the current probability model Pc is updated each time a new symbol is coded.

Figure 3:
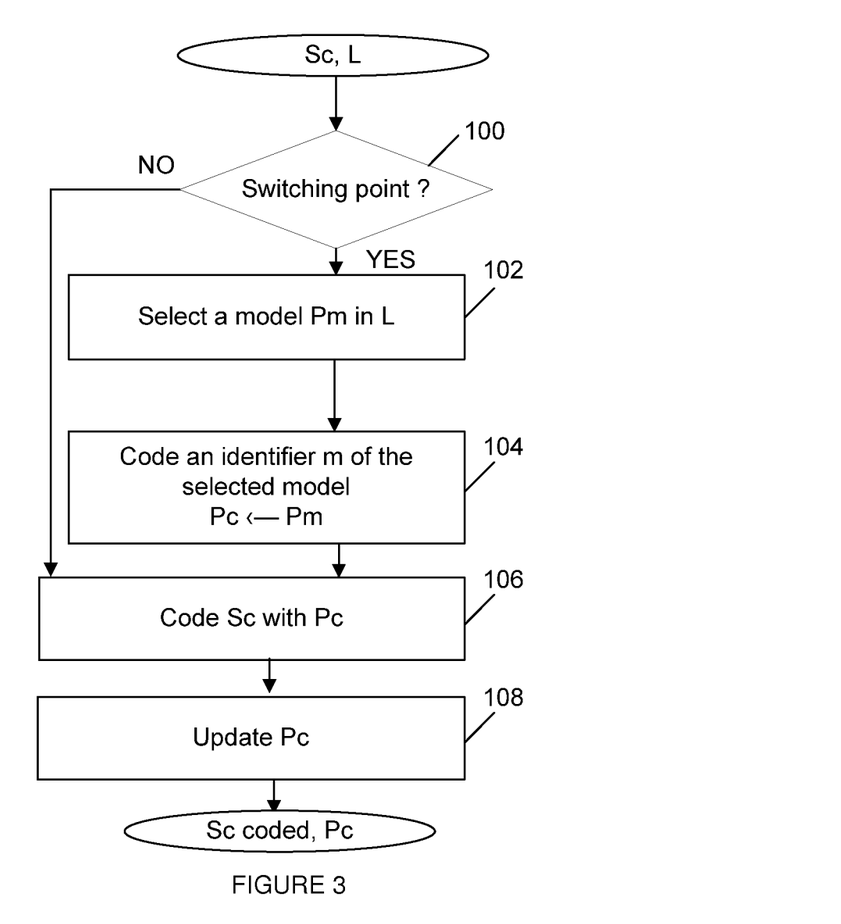
FIG. 3 illustrates an arithmetic coding method according to a first embodiment of the invention.
Figure 4:
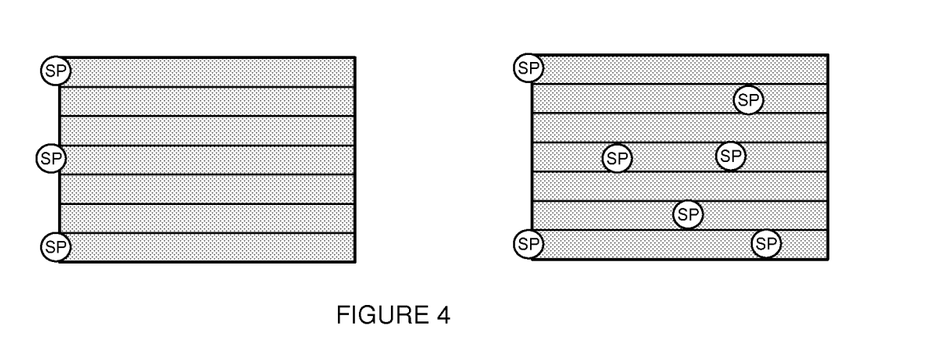
FIG. 4 represents two images in which are distributed switching points SP.

FIG. 3 illustrates an arithmetic coding method according to a first embodiment of the invention. During a step 100, it is verified to see if it is situated on a switching point SP. A switching point SP is defined according to the invention as a point in the stream at the level of which the probability model used to code the current symbol can be modified. The switching points SP are distributed in the stream, either uniformly or irregularly. For example, the switching points SP are distributed in the stream so as to correspond either to the starts of block lines as shown on the left part of FIG. 4, or irregularly as shown on the right part of FIG. 4. For example, the switching points are distributed every N block, where N is an integer. According to a variant, the switching points are distributed every N coded block according to a given mode, for example the N blocks coded according to the INTRA mode. According to another variant, the switching points are distributed in the stream irregularly and their positions in the stream are transmitted in the stream. According to another variant, a switching point can be signalled by a particular sequence of bits in the stream.

If located at a switching point SP the method continues to a step 102, if not it continues to a step 106.

During the step 102, a probability model Pm is selected in a set L of at least two probability models $\{Pi\}_{i \in [0; M]}$ according to a coding cost criterion, where M is an integer. M is the number of probability models in the set L. This step is detailed in FIG. 5.

Figure 5:
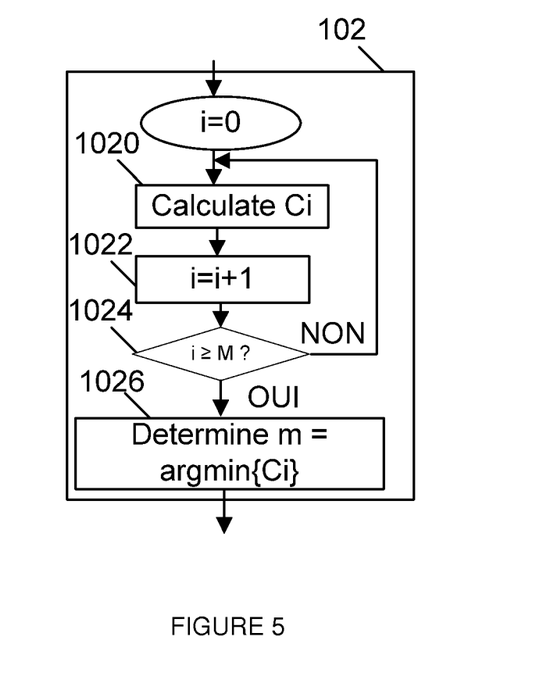
FIG. 5 illustrates a particular step of the arithmetic coding method according to one of the embodiments illustrated in FIGS. 3, 6 and 7.

During a step 1020, the coding cost Ci associated with the model Pi of L is calculated. For example, in the case where the symbols are representative of an image divided into blocks of image data, J blocks of image data that follow in coding order the current block with which is associated the symbol Sc are coded, where J is an integer. The coding cost Ci associated with the coding of J blocks is thus calculated. According to a variant, the distortion Di associated with the coding of the J blocks of image data with the probability model Pi is also calculated. According to this variant, the coding cost is replaced by the weighted sum of the coding cost and the associated distortion:

$$Ci = Di + \lambda \cdot Ci.$$

During a step 1022, the index i is incremented by 1.

During a step 1024, the value of i is compared to M. If i<M then the method returns to step 1020 with the new value of i, if not the method continues to step 1026.

During step 1026, the probability model Pi of the set L for which the associated coding cost Ci is lowest is selected as being the model Pm.

During a step 104, an identifier m of the model selected in the set L is coded in the stream. Advantageously this identifier enables a decoding method to find again in the set L the model selected by the coding method. The probability model Pm is recopied in the model Pc, i.e. the probability model Pm selected in step 102 becomes the current probability model Pc. During step 106, the current symbol Sc is coded with the current probability model Pc.

During a step 108, the current probability model Pc is updated according to the method described previously in reference to the AC coding.

Figure 6:
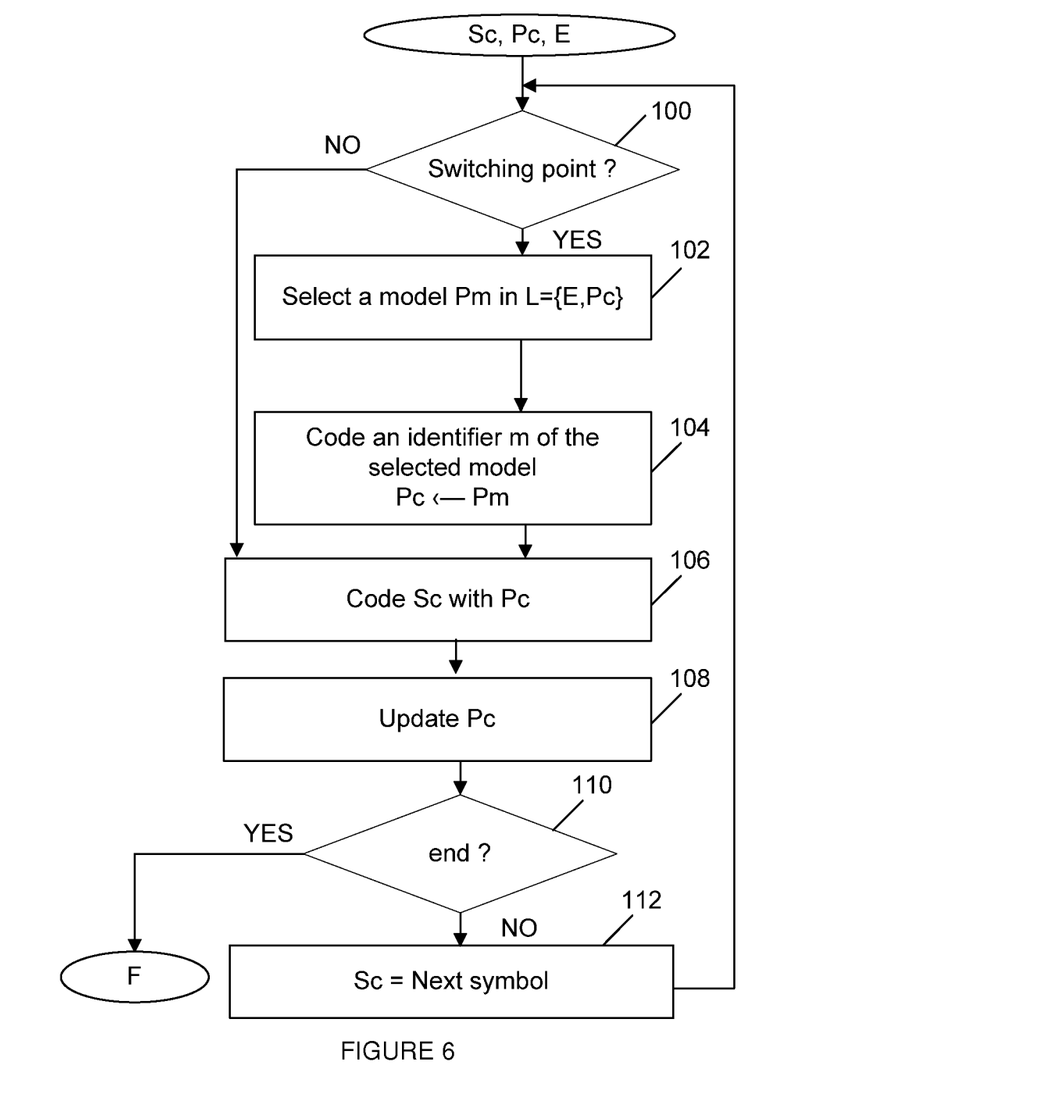
FIG. 6 illustrates an arithmetic coding method according to a second embodiment of the invention.

According to a second embodiment shown in FIG. 6, the steps 100 to 108 are reiterated to code a succession of symbols. The steps of FIG. 6 identical to the steps of FIG. 3 are identified on FIG. 6 by the same numerical references.

During step 100, it is verified if the location is on a switching point SP.

If located at a switching point SP the method continues to step 102, if not it continues to step 106.

During the step 102, a probability model Pm is selected in a set L of at least two probability models $\{Pi\}_{i \in E[0; M]}$ according to a coding cost criterion, where M is an integer. M is the number of probability models in the set L. The set L comprises the current probability model Pc which is defined from the symbols coded previous to the current symbol Sc and the subset E of probability models defined by default. The subset E comprises at least one such probability model defined by default noted as P0. For example, P0 is a uniform probability model, i.e. all the probabilities of this model are equal. The subset E may contain other models defined by default such as a Gaussian probability model or models obtained by learning on a database representative of the signal to be coded. Note that if the current symbol Sc is the first symbol coded then the current probability model Pc is defined by default in which case it may be identical to the model P0 of E. If the current symbol Sc is not the first symbol coded, then the current probability model Pc is defined using the symbols coded previous to the current symbol Sc. Such a probability model Pc has, in fact, been updated during the coding of symbols coded previous to the current symbol Sc so as to dynamically adapt to the characteristics of the source signal. Step 102 is detailed on FIG. 5.

During a step 1020, the coding cost Ci associated with the model Pi of L is calculated. For example, in the case where the symbols are representative of an image divided into blocks of image data, J blocks of image data that follow in coding order the current block with which is associated the symbol Sc are coded, where J is an integer. The coding cost Ci associated with the coding of J blocks is thus calculated. According to a variant, the distortion Di associated with the coding of the J blocks of image data with the probability model Pi is also calculated. According to this variant, the coding cost is replaced by the weighted sum of the coding cost and the associated distortion:

$$Ci = Di + \lambda Ci.$$

During a step 1022, the index i is incremented by 1.

During a step 1024, the value of i is compared to M. If i<M then the method returns to step 1020 with the new value of i, if not the method continues to step 1026.

During step 1026, the probability model Pi of the set L for which the associated coding cost Ci is lowest is selected as being the model Pm.

During a step 104, an identifier m of the model selected in the set L is coded in the stream. Advantageously this identifier enables a decoding method to again find in the set L the model selected by the coding method. The probability model Pm is recopied in the model Pc, i.e. the probability model Pm selected in step 102 becomes the current probability model Pc.

During step 106, the current symbol Sc is coded with the current probability model Pc.

During a step 108, the current probability model Pc is updated according to the method described previously in reference to the AC coding.

During a step 110, it is verified if the set of symbols has been coded. If the set of symbols has been coded then the method ends, if not the method continues to a step 112.

During the step 112, the next symbol to be coded becomes the current symbol Sc. The method repeats then with this new current symbol in step 100.

According to a first variant of this second embodiment, during step 102, a probability model Pm is selected in E according to a similarity criterion with the current probability model Pc, i.e. the model Pm selected is the model of E that has a greater similarity with the current model Pc. The similarity between the two probability models P1 and P2 is for example calculated as follows:

$$\left[ -\sum_{a_j \in A} |P1(Sc = a_i) - P2(Sc = a_i)| \right]$$

or again as follows $$\left[-\underset{A}{\operatorname{Max}}(|P1(Sc = a_i) - P2(Sc = a_i)|)\right],$$

where $A=\{a_i\}_{i \in I}$ represents the set of possible values of the symbol Sc and where I is a set of indexes identifying said possible values.

According to a second variant of this second embodiment, during step 102, a probability model Pm is selected in E according to a similarity criterion with the current probability model Pc, i.e. the model Pm selected is the model of E that has a greater similarity with the current probability model Pc providing that this similarity is higher than a threshold value. In the contrary case Pm=Pc.

In the case of these variants, that is, the selection of the model Pm according to a similarity criterion with the current probability model Pc, no identifier m of the model selected in the set E is coded in the stream. In fact, the model Pm is selected in the same way on the decoder side as on the encoder side. Step 104 is thus omitted.

Figure 7:
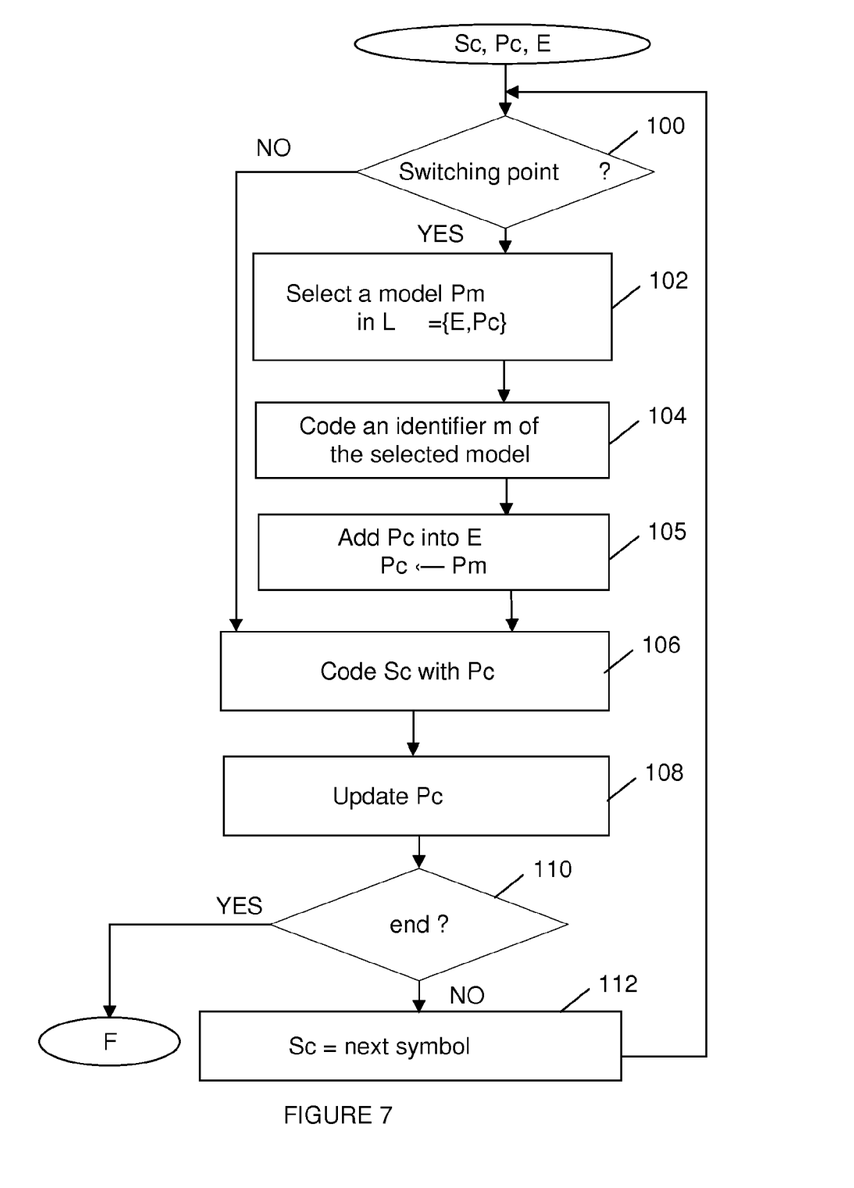
FIG. 7 illustrates an arithmetic coding method according to a third embodiment of the invention.

A third embodiment is shown in FIG. 7. The steps of FIG. 7 identical to those of FIGS. 3 and 6 are identified on FIG. 7 by the same numerical references.

During step 100, it is verified if the location is on a switching point SP. If located at a switching point SP the method continues to step 102, if not it continues to step 106.

During the step 102, a probability model Pm is selected in a set L of at least two probability models $\{Pi\}_{i \in [0; M]}$ according to a coding cost criterion, where M is an integer. M is the number of probability models in the set L. The set L comprises the current probability model Pc which is defined from the symbols coded previous to the current symbol Sc and the subset E of probability models defined by default. The subset E comprises at least one such probability model defined by default noted as P0. For example, P0 is a uniform probability model, i.e. all the probabilities of this model are equal. The subset E may contain other models defined by default such as a Gaussian probability model or models obtained by learning on a database representative of the signal to be coded. Note that if the current symbol Sc is the first symbol coded then the current probability model Pc is defined by default in which case it may be identical to the model P0 of E. If the current symbol Sc is not the first symbol coded, then the current probability model Pc is defined using the symbols coded previous to the current symbol Sc. Such a probability model Pc has, in fact, been updated during the coding of symbols coded previous to the current symbol Sc so as to dynamically adapt to the characteristics of the source signal. Step 102 is detailed on FIG. 5.

During a step 1020, the coding cost Ci associated with the model Pi of L is calculated. For example, in the case where the symbols are representative of an image divided into blocks of image data, J blocks of image data that follow in coding order the current block with which is associated the symbol Sc are coded, where J is an integer. The coding cost Ci associated with the coding of J blocks is thus calculated. According to a variant, the distortion Di associated with the coding of the J blocks of image data with the probability model Pi is also calculated. According to this variant, the coding cost is replaced by the weighted sum of the coding cost and the associated distortion:

$Ci=Di+\lambda Ci$.

During a step 1022, the index i is incremented by 1.

During a step 1024, the value of i is compared to M. If i<M then the method returns to step 1020 with the new value of i, if not the method continues to step 1026.

During step 1026, the probability model Pi of the set L for which the associated coding cost Ci is lowest is selected as being the model Pm.

During a step 104, an identifier m of the model selected in the set L is coded in the stream. Advantageously this identifier enables a decoding method to again find in the set L the model selected by the coding method.

During a step 105, the current probability model Pc is added to the subset E then the probability model selected Pm is re-copied in the model Pc, i.e. the probability model Pm selected in step 102 becomes the current probability model Pc. Note that the probabilities of the probability model Pc added in the subset E are not modified. Due to this step 105 the coding method according to the third embodiment is more efficient with respect to the coding method according to the second embodiment described in reference to FIG. 6. In fact, in this case the content of the subset E varies dynamically according to the coding of symbols by integrating possibly at each coding of a new current symbol, the current probability model that is associated with it. The subset E thus defined thus comprises more probability models adapted to the characteristics of the source signal, i.e. defined using the coding of symbols coded previous to the current symbol Sc. For example, imagining that E comprises initially a unique probability model defined by default noted as P0 and that the current symbol Sc is the $k^{st}$ symbol coded, then to code this symbol according to the second embodiment only the following probability models are tested during step 102. P0 and $P_C^{K-1}$, wherer $P_C^{K-1}$ is the current probability model updated in step 108 during the coding of the $(k-1)^{st}$ symbol. However according to the third embodiment the following probability models are tested: P0, $P_C^{K-1}$, $\{P_C^{K-m}\}$, where m depends on the size SizeE of E and where $\{P_C^{K-m}\}$ comprises the probability models added to E during the coding of symbols coded previous to the $K^{st}$ symbol in the switching points. This step is detailed on FIG. 8.

Figure 8:
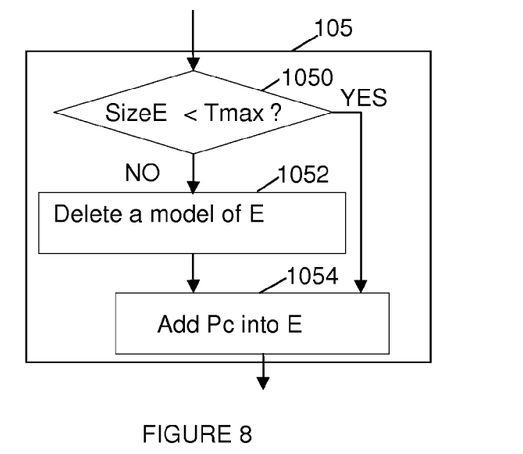
FIG. 8 illustrates a particular step of the arithmetic coding method according to the embodiment illustrated in FIG. 7.

During a step 1050, the size SizeE of E is compared to a threshold value Tmax. If SizeE<Tmax then the method continues to step 1054. If not, the method continues to step 1052.

During step 1052, one probability model is deleted from the subset E with the exception of the second probability model defined by default noted as P0. The deleted probability model is for example the oldest model in the subset E. According to a variant, the deleted probability model is the model that is least often selected. According to another variant, the deleted probability model is, among the P probability models least often selected, the probability model for which the average coding costs calculated in step 1020 when the probability model in question was selected was highest.

During a step 1054, the current probability model Pc is added in E.

During step 106, the current symbol Sc is coded with the current probability model Pc.

During a step 108, the current probability model Pc is updated according to the method described previously in reference to the AC coding.

During a step 110, it is verified if the set of symbols has been coded. If the set of symbols has been coded then the method ends, if not the method continues to a step 112.

During a step 112, the next symbol to be coded becomes the current symbol Sc. The method repeats then with this new current symbol in step 100.

According to a first variant of this second embodiment, during step 102, a probability model Pm is selected in E according to a similarity criterion with the current probability model Pc, i.e. the model Pm selected is the model of E that has a greater similarity with the current model Pc. The similarity between the two probability models P1 and P2 is for example calculated as follows:

$$\left[-\sum_{a_i \in A} |P1(Sc = a_i) - P2(Sc = a_i)|\right]$$

or again as follows $$\left[-\operatorname*{Max}_{A}(|P1(Sc = a_i) - P2(Sc = a_i)|)\right],$$

where $A=\{a_i\}_{i \in I}$ represents the set of possible values of the symbol Sc and where I is a set of indexes identifying said possible values.

According to a second variant of this second embodiment, during step 102, a probability model Pm is selected in E according to a similarity criterion with the current probability model Pc, i.e. the model Pm selected is the model of E that has a greater similarity with the current probability model Pc providing that this similarity is higher than a threshold value. In the contrary case Pm=Pc.

In the case of these variants, that is, the selection of the model Pm according to a similarity criterion with the current probability model Pc, no identifier m of the model selected in the set E is coded in the stream. In fact, the model Pm is selected in the same way on the decoder side as on the coder side. Step 104 is thus omitted.

According to a variant of the invention that can be applied to a sequence of images, the arithmetic coding method comprises a step of initialisation of the subset E by the probability model defined by default P0 at the start of each image or each slice of images.

According to another variant, the initialisation step of the subset E by the probability model defined by default P0 is only applicable in reference images. A reference image is an image that is used to predict another image for coding this other image.

Figure 9:
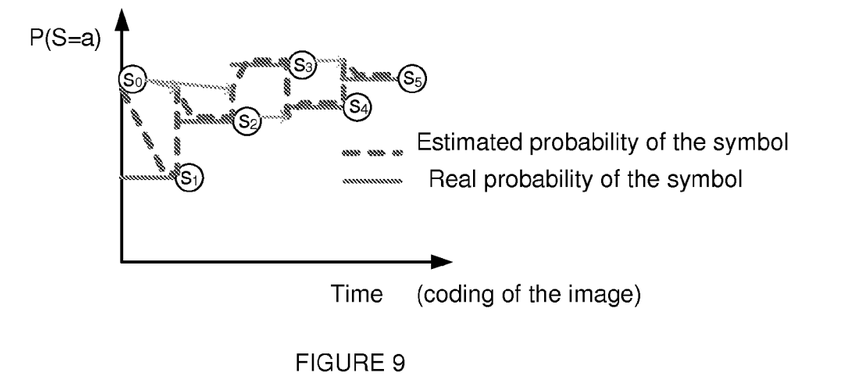
FIG. 9 represents the change, during the coding of a source signal, in the real probability and in the estimated probability according to the method of the invention that a symbol S takes a value 'a'.

In FIG. 9 is shown on the x-axis the progression of the coding process of an image and on the y-axis the probability that the symbol S takes the value 'a'. The full lines represent the change in the real probability P(S=a) and the dotted lines represent the corresponding estimated probability during the coding of the image according to the method of the invention. The estimated probability is updated during step 108 according to the coding of the image. The convergence time is considerably reduced with respect to the AC method (FIG. 2).

Figure 10:
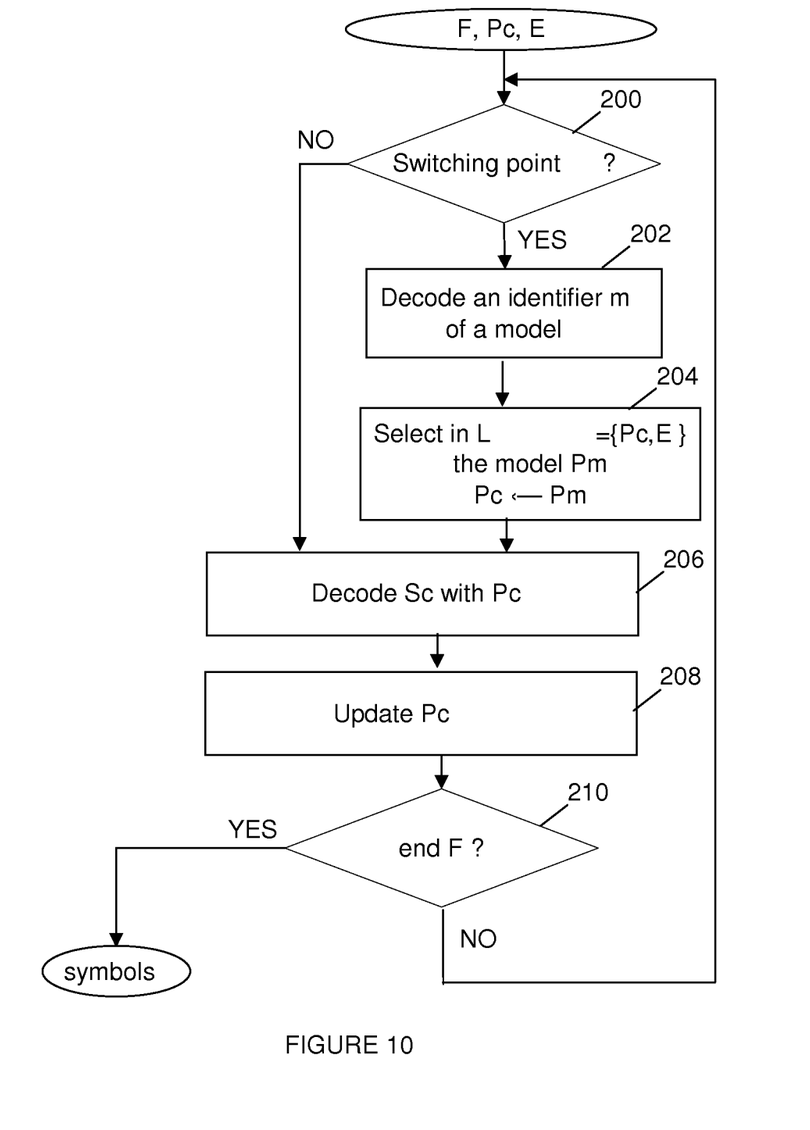
FIG. 10 illustrates a arithmetic decoding method according to a particular embodiment.

The method for decoding a stream F according to the invention is represented in FIG. 10.

During a step 200, it is verified if the location is on a switching point SP. A switching point SP is defined according to the invention as a point in the stream at the level of which the probability model used to code the current symbol can be modified. The positions of switching points are determined for example by decoding said positions coded in said stream. According to another variant, the switching points are distributed every N blocks, where N is an integer. According to another variant, the switching points are distributed every N coded block according to a given mode, for example every N block coded according to the INTRA mode. If located at a switching point SP the method continues to a step 202, if not it continues to a step 206.

During a step 202, an identifier m is decoded from the stream F. This identifier enables identification of a probability model in a set L of at least two probability models. The set L comprises the current probability model Pc which is defined from the symbols coded previous to the current symbol Sc and a subset E of probability models defined by default. The subset E comprises at least one such probability model defined by default noted as P0. For example, P0 is a uniform probability model, i.e. all the probabilities of this model are equal. The subset E may contain other models defined by default such as a Gaussian probability model or models obtained by learning on a database representative of the signal to be coded.

During a step 204, the probability model of L for which the identifier is m is selected. The probability model Pm is recopied in the model Pc, i.e. the probability model Pm selected in step 202 becomes the current probability model Pc.

During a step 206, the current symbol Sc is decoded with the current probability model Pc.

During a step 208, the current probability model Pc is updated according to the method described previously in reference to the AC coding.

During a step 210, it is verified if the set of symbols has been decoded. If the set of symbols has been decoded then the method ends, if not the method continues to a step 200 to decode a next symbol.

According to a first variant of this embodiment, during step 204, a probability model Pm is selected in E according to a similarity criterion with the current probability model Pc, i.e. the model Pm selected is the model of E that has a greater similarity with the current model Pc. The similarity between the two probability models P1 and P2 is for example calculated as follows:

$$\left[-\sum_{a_i \in A} |P1(Sc = a_i) - P2(Sc = a_i)|\right]$$

or again as follows $$\left[-\operatorname*{Max}_{A}(|P1(Sc = a_i) - P2(Sc = a_i)|)\right],$$

where $A=\{a_i\}_{i \in I}$ represents the set of possible values of the symbol Sc and where I is a set of indexes identifying said possible values.

According to a second variant of this second embodiment, during step 102, a probability model Pm is selected in E according to a similarity criterion with the current probability model Pc, i.e. the model Pm selected is the model of E that has a greater similarity with the current probability model Pc providing that this similarity is higher than a threshold value. In the contrary case Pm=Pc.

In the case of these variants, that is, the selection of the model Pm according to a similarity criterion with the current probability model Pc, no identifier m of the model selected in the set E is decoded in the stream. Step 202 is thus omitted.

Figure 11:
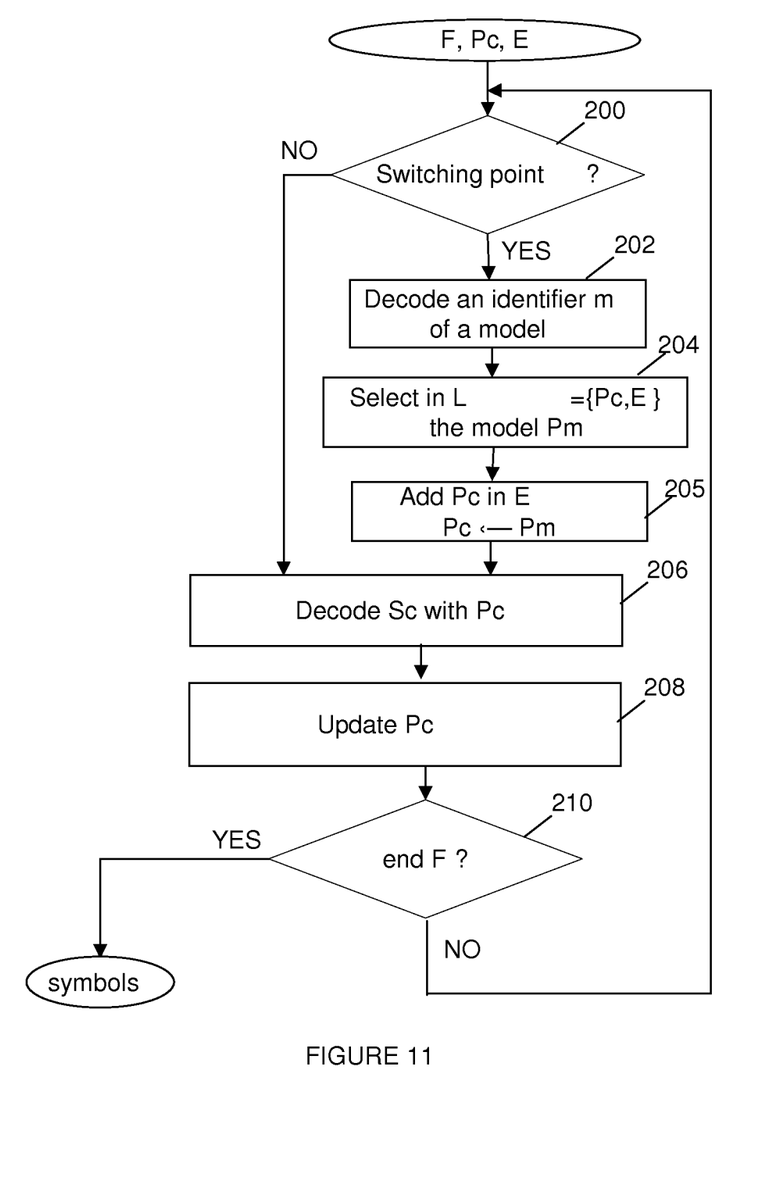
FIG. 11 illustrates a arithmetic decoding method according to another particular embodiment.

Another embodiment is represented in FIG. 11. The steps of FIG. 11 identical to the steps of FIG. 10 are identified on FIG. 11 by the same numerical references.

During a step 200, it is verified if the location is on a switching point SP. A switching point SP is defined according to the invention as a point in the stream at the level of which the probability model used to code the current symbol can be modified. The positions of switching points are determined for example by decoding said positions coded in said stream. According to another variant, the switching points are distributed every N blocks, where N is an integer. According to another variant, the switching points are distributed every N coded block according to a given mode, for example every N blocks coded according to the INTRA mode. According to another variant, a switching point can be signalled by a particular sequence of bits in the stream. If located at a switching point SP the method continues to a step 202, if not it continues to a step 206.

During a step 202, an identifier m is decoded from the stream F. This identifier enables identification of a probability model in a set L of at least two probability models. The set L comprises the current probability model Pc which is defined from the symbols coded previous to the current symbol Sc and a subset E of probability models defined by default. The subset E comprises at least one such probability model defined by default noted as P0. For example, P0 is a uniform probability model, i.e. all the probabilities of this model are equal. According to a variant, P0 is a probability model defined in a standard. The subset E may contain other models defined by default such as a Gaussian probability model or models obtained by learning on a database representative of the signal to be coded. Note that if the current symbol Sc is the first symbol coded then the current probability model Pc is defined by default in which case it may be identical to the model P0 of E. If the current symbol Sc is not the first symbol coded, then the current probability model Pc is defined using the symbols coded previous to the current symbol Sc. Such a probability model Pc has, in fact, been updated during the coding of symbols coded previous to the current symbol Sc so as to dynamically adapt to the characteristics of the source signal.

During a step 204, the probability model of L for which the identifier is m is selected.

During a step 205, the current probability model Pc is added to the subset E This step is detailed in FIG. 8. The probability model Pm is re-copied in the current probability model Pc, i.e. the probability model Pm selected in step 204 becomes the current probability model Pc. This step is identical to step 105 of the coding method according to the third embodiment.

During a step 1050, the size SizeE of E is compared to a threshold value Tmax. If SizeE<Tmax then the method continues to step 1054. If not, the method continues to step 1052.

During step 1052, one probability model is deleted from the subset E with the exception of the second probability model defined by default noted as P0. The deleted probability model is for example the oldest model in the subset E. According to a variant, the deleted probability model is, among the P probability models least often selected, the probability model for which the average coding cost calculated when the probability model in question is selected is highest.

During a step 206, the current symbol Sc is decoded with the current probability model Pc which is the probability model Pm selected in step 204. During a step 208, the current probability model Pc is updated according to the method described previously in reference to the AC coding. The step of updating on the decoder side is identical to that carried out on the coder side. During a step 210, it is verified if the set of symbols has been decoded. If the set of symbols has been decoded then the method ends, if not the method continues at step 200 to decode a new symbol.

According to a first variant of this embodiment, during step 204, a probability model Pm is selected in E according to a similarity criterion with the current probability model Pc, i.e. the model Pm selected is the model of E that has a greater similarity with the current model Pc. The similarity between the two probability models P1 and P2 is for example calculated as follows:

$$\left[-\sum_{a_i \in A} |P1(Sc = a_i) - P2(Sc = a_i)|\right]$$

or again as follows $$\left[-\mathrm{Max}_{A}(|P1(Sc = a_i) - P2(Sc = a_i)|)\right],$$

where $A=\{a_i\}_{i \in I}$ represents the set of possible values of the symbol Sc and where I is a set of indexes identifying said possible values.

According to a second variant of this second embodiment, during step 102, a probability model Pm is selected in E according to a similarity criterion with the current probability model Pc, i.e. the model Pm selected is the model of E that has a greater similarity with the current probability model Pc providing that this similarity is higher than a threshold value. In the contrary case Pm=Pc.

In the case of these variants, that is, the selection of the model Pm according to a similarity criterion with the current probability model Pc, no identifier m of the model selected in the set E is decoded in the stream. Step 202 is thus omitted.

Figure 12:
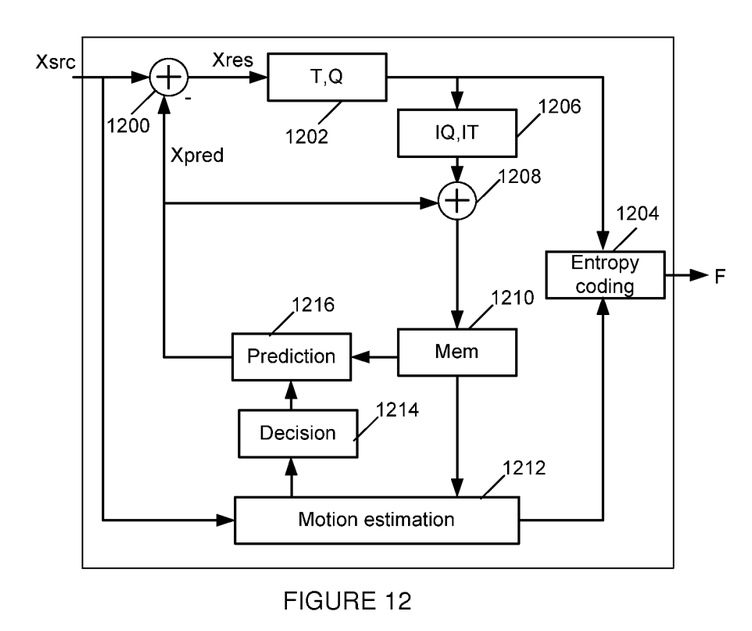
FIG. 12 shows a coding device according to the invention.

A device 12 for coding images in accordance with the invention is shown in FIG. 12. The coding device 12 receives at input images I belonging to a sequence of images. Each image is divided into blocks of pixels to each of which is associated at least one item of image data. The coding device 12 notably comprises a calculation module 1200 able to subtract pixel by pixel from a current block Xsrc a prediction block Xpred to generate a residual image data block or residual block noted as Xres. It further comprises a module 1202 able to transform then quantize the residual block Xres into quantized data. The transform T is for example a Discrete Cosine Transform (DCT). The coding module 12 further comprises an entropy coding module 1204 able to code the quantized data into a stream F of coded data. The entropy coding module 1204 implements the steps 100, 102, 104, 106, 108, 110 and 112 and possibly step 102 of the arithmetic coding method according to the invention. It also comprises a module 1206 carrying out the inverse operation of module 1202. The module 1206 carries out an inverse quantization IQ followed by an inverse transform IT. The module 1206 is connected to a calculation module 1208 able to add pixel by pixel the block of data from the module 1206 and the prediction block Xpred to generate a block of reconstructed image data that is stored in a memory 1210.

The coding device 12 further comprises a motion estimation module 1212 able to estimate at least one motion vector between the block Xsrc and a reference image stored in the memory 1210, this image having previously been coded then reconstructed. According to a variant the motion estimation can be carried out between the current block Xsrc and the original reference image. According to a method well known to those skilled in the art, the motion estimation module 1212 searches in the reference image for a motion vector so as to minimise an error calculated between the current block Xsrc and a reference block Xref in the reference image identified using said motion vector. According to a variant the coding device 12 does not comprise a motion estimation module, in which case the image data blocks Xsrc are coded according to an INTRA coding mode possibly with spatial prediction. The motion data are transmitted by the motion estimation module 1212 to a decision module 1214 able to select a coding mode for the block Xsrc in a predefined set of coding modes. The term "motion data" is to be understood in the widest sense, i.e. motion vector and possibly a reference image index identifying the image in the sequence of images.

The coding mode retained is for example the one that minimizes a bitrate-distortion type criterion. However, the invention is not restricted to this selection method and the mode retained can be selected according to another criterion for example an a priori type criterion. The coding mode as well as possibly the motion data in the case of a temporal prediction mode or INTER mode, selected by the decision module 1214, are transmitted to a prediction module 1216. The coding mode and possible the motion data are also transmitted to the entropy coding module 1204 to be coded in the stream F. The prediction module 1216 determine the prediction block Xpred from notably the reference images Ir previously reconstructed and stored in the memory 1210, the coding mode and possibly the motion data selected by the decision module 1214.

Figure 13:
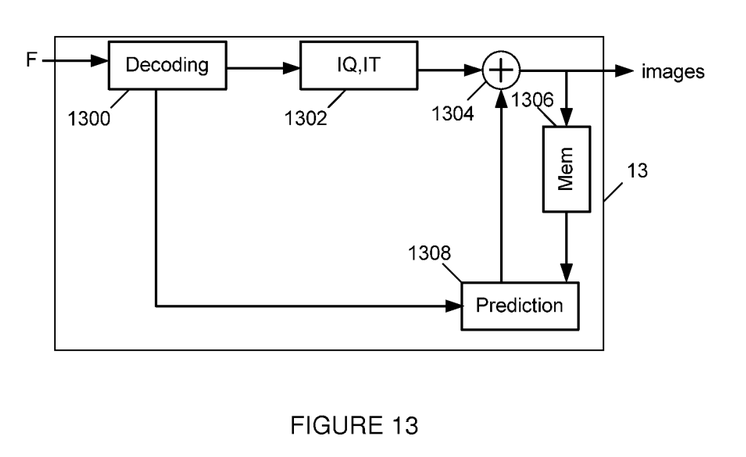
FIG. 13 shows a decoding device according to the invention.

A decoding device in accordance with the invention is shown in FIG. 13. The decoding device 13 receives at input a stream F of coded data representative of a sequence of images. The stream F is for example generated and transmitted by a coding device 12. The decoding device 13 comprises an entropy decoding module 1300 able to generate decoded data, for example coding modes and decoded data relating to the content of the images. For this purpose, the entropy decoding module 1300 implements the steps 200, 202, 204, 206, 208, 210 and possibly 205 of the arithmetic decoding method according to the invention.

The decoded data relative to the content of images that correspond to quantized data from the module 1202 of the coding device 12 are then transmitted to a module 1302 able to carry out an inverse quantization followed by an inverse transform. The module 1302 is identical to the module 1206 of the coding module 12 having generated the coded stream F. The module 1302 is connected to a calculation module 1304 able to add pixel by pixel, the block from the module 1302 and a prediction block Xpred to generate a block of reconstructed image data that is stored in a memory 1306. The decoding device 13 comprises in addition a prediction module 1308 identical to the module 1216 of the coding device 12. The prediction module 1308 determines prediction module Xpred from notably reference images Ir previously reconstructed and stored in the memory 1306, the coding mode and possibly the motion data decoded for the current block Xsrc by the entropy decoding module 1300.

In FIGS. 11 and 12, the modules shown are functional units that may or may not correspond to physically distinguishable units. For example, these modules or some of them can be grouped together in a single component, or constitute functions of the same software. On the contrary, some modules may be composed of separate physical entities. As an example, the module 1202 can be implemented by separate components, one carrying out a transform and the other a quantization.

Naturally, the invention is not limited to the embodiment examples mentioned above. In particular, those skilled in the art may apply any variant to the stated embodiments and combine them to benefit from their various advantages. Notably, the arithmetic coding and decoding methods apply to all symbol types (i.e. images, audio, 3D, etc.). The arithmetic coding and decoding methods according to the invention are not linked to a coding standard.

The invention claimed is:

1. Arithmetic coding method for symbols in a stream, comprising the following steps applied at switching points distributed in said stream to code a current symbol:
    selecting, according to a coding cost criterion, a probability model in a set comprising a current probability model defined using symbols coded previous to the current symbol and a subset of probability models wherein subset comprises at least one probability model defined by default,
    coding an identifier of the selected probability model;
    adding in said subset said current probability model, the selected probability model becoming the current probability model,
    coding said current symbol with said current probability model, and
    updating said current probability model according to the coding of said current symbol.

2. Arithmetic coding method according to claim 1, wherein when the number of probability models in said subset of probability models is equal to a threshold value, said current probability model is added as a replacement for the probability model of said subset of probability models least often selected with the exception of the second probability model defined by default.

3. Arithmetic coding method according to claim 1, wherein when the number of probability models in said subset of probability models is equal to a threshold value, said current probability model is added as a replacement for the oldest probability model in said subset with the exception of the probability model defined by default.

4. Arithmetic coding method according to claim 1, wherein when the number of probability models in said subset of probability models is equal to a threshold value, said current probability model is added as a replacement, among the P probability models of said subset least often selected, of the probability model for which the average of coding costs calculated when said probability model is selected is highest with the exception of the probability model defined by default, where P in an integer.

5. Arithmetic coding method according to claim 1 wherein said switching points are distributed uniformly in said stream.

6. Arithmetic coding method according to claim 1, wherein the distribution of said switching points in said stream is according to the number of blocks coded according to a given coding mode.

7. Arithmetic coding mode method according to claim 1, wherein the positions of said stream of said switching points are transmitted in said stream.

8. Arithmetic coding mode method according to claim 1, wherein the positions in stream of said switching points are signalled by a particular sequence of bits.

9. Arithmetic coding method according to claim 1, further comprising a step of initialisation of said subset of probability models by said probability model defined by default at the start of each image or of each image slice.

10. Arithmetic decoding method for symbols coded in the form of a stream, comprising the following steps applied at switching points distributed in said stream to decode a current symbol:
    decoding from the stream, for said current symbol, a probability model identifier,
    selecting using said probability model identifier a probability model in a set comprising a current probability model defined from symbols coded previous to the current symbol and a subset of probability models wherein subset comprises at least one probability model defined by default, adding in said subset said current probability model, the selected probability model becoming the current probability model, decoding said current symbol with said current probability model, and updating said current probability model according to the decoding of said current symbol.

11. Arithmetic decoding method according to claim 10, wherein when the number of probability models in said subset of probability models is equal to a threshold value, said current probability model is added as a replacement for the probability model of said subset of probability models least often selected with the exception of the second probability model defined by default.

12. Arithmetic decoding method according to claim 10 wherein when the number of probability models in said subset of probability models is equal to a threshold value, said current probability model is added as a replacement for the oldest probability model in said subset with the exception of the probability model defined by default.

13. Arithmetic decoding method according to claim 10, wherein when the number of probability models in said subset of probability models is equal to a threshold value, said current probability model is added as a replacement, among the P probability models of said subset least often selected, of the probability model for which the average of coding costs calculated when said probability model is selected is highest with the exception of the probability model defined by default, where P in an integer.

14. Arithmetic coder for coding symbols in a stream:
means for selecting, at switching points distributed in said stream to code a current symbol, according to a coding cost criterion, a probability model in a set comprising a current probability model defined using symbols coded previous to the current symbol and a subset of probability models wherein subset comprises at least one probability model defined by default, means for coding an identifier of the selected probability model;

means for adding in said subset said current probability model, the selected probability model becoming the current probability model, means for coding said current symbol with said current probability model, and means for updating said current probability model according to the coding of said current symbol.

15. Arithmetic decoder for decoding symbols coded in the form of a stream, comprising:

means for decoding from the stream, at switching points distributed in said stream to decode a current symbol, for said current symbol, a probability model identifier, means for selecting using said probability model identifier a probability model in a set comprising a current probability model defined from symbols coded previous to the current symbol and a subset of probability models wherein subset comprises at least one probability model defined by default, means for adding in said subset said current probability model, the selected probability model becoming the current probability model, means for decoding said current symbol with said current probability model, and means for updating said current probability model according to the decoding of said current symbol.

* * * * *